(12) United States Patent
McDermott, III et al.

(10) Patent No.: US 9,437,800 B1
(45) Date of Patent: Sep. 6, 2016

(54) SYSTEMS AND METHODS FOR SUPPRESSING MAGNETICALLY ACTIVE SURFACE DEFECTS IN SUPERCONDUCTING CIRCUITS

(71) Applicants: Robert Francis McDermott, III, Madison, WI (US); Pradeep Kumar, Madison, WI (US)

(72) Inventors: Robert Francis McDermott, III, Madison, WI (US); Pradeep Kumar, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/632,505

(22) Filed: Feb. 26, 2015

(51) Int. Cl.
*H01L 21/00* (2006.01)
*H01L 39/04* (2006.01)
*H01L 27/18* (2006.01)
*H01L 39/24* (2006.01)

(52) U.S. Cl.
CPC ............. *H01L 39/045* (2013.01); *H01L 27/18* (2013.01); *H01L 39/2493* (2013.01)

(58) Field of Classification Search
None
See application file for complete search history.

*Primary Examiner* — Seahvosh Nikmanesh
(74) *Attorney, Agent, or Firm* — Quarles & Brady, LLP (57) ABSTRACT

Systems and methods for suppressing magnetically active surface defects in superconducting quantum circuits are provided. A method includes providing one or more superconducting quantum circuits, and arranging the one or more superconducting quantum circuits in a hermetic enclosure capable of isolating the one or more superconducting circuits from ambient surroundings. The method also includes controlling an environment in the hermetic enclosure to suppress magnetically active surface defects associated with the one or more superconducting quantum circuits. In some aspects, the method further includes introducing an inert gas into the hermetic enclosure to passivate a surface of the one or more superconducting quantum circuits. In other aspects, the method further includes coating a surface of the one or more superconducting circuits with a non-magnetic encapsulation layer. In yet other aspects, the method further includes irradiating the one or more superconducting circuits using ultraviolet light.

28 Claims, 10 Drawing Sheets

SYSTEMS AND METHODS FOR SUPPRESSING MAGNETICALLY ACTIVE SURFACE DEFECTS IN SUPERCONDUCTING CIRCUITS

STATEMENT REGARDING FEDERALLY SPONSORED RESEARCH

This invention was made with government support under W911NF-10-1-0494 and W911NF-09-1-0375 awarded by the ARMY/ARO. The government has certain rights in the invention.

BACKGROUND OF THE INVENTION

The field of the disclosure is directed to superconducting quantum circuits and devices. More particularly, the disclosure is directed to systems and methods related to quantum information processing and quantum computation.

Superconducting integrated circuits are finding increased use in a variety of applications. For instance, in the field of quantum computation, the performance of superconducting quantum bits ("qubits") has advanced rapidly in recent years, with preliminary multi-qubit implementations leading toward scalable, surface code architectures. In contrast to classical computational methods that rely on binary data stored in the form of definite on/off states, or bits, methods in quantum computation take advantage of the quantum mechanical nature of superconducting quantum systems, which may be represented using a superposition of multiple quantum states.

However, maintaining a superposition state is challenging for practical implementations. This is because various sources of noise induce a loss of quantum ordering, or coherence in the phase angles between the different components of the system in quantum superposition. Such dephasing makes the realization of quantum computers difficult, since sufficient preservation of coherent quantum states is required in order to perform useful computation. For superconducting qubits, low-frequency magnetic flux noise is a dominant source of dephasing, resulting in appreciable errors when implemented in large-scale circuits. In addition, the magnitude of flux noise is roughly universal across various different device materials and fabrication processes. Despite thirty years of research, there has been no successful demonstration of reducing this noise, placing severe limitations on progress in quantum information processing and quantum computation.

In general, during the fabrication process, superconducting devices are exposed to ambient atmospheric surroundings for extended periods of time. Subsequently, in operation, the superconducting devices are cooled to low temperatures, typically using vacuum cryostats that maintain poor background pressure, allowing the adsorption of a high density of magnetically active defects. Such defects can produce low-frequency magnetic flux noise that leads to strong dephasing. In the case of qubit devices, some efforts to avoid magnetic flux noise have been made by operating the devices at fixed frequencies where the qubit is insensitive to first order to magnetic flux fluctuations. However, such implementations severely constrain the architectures of multi-qubit circuits and make scaling to larger systems a major challenge.

In light of the above, there remains a need for novel approaches that address noise sources affecting superconducting integrated circuits.

SUMMARY OF THE INVENTION

The present disclosure introduces a novel approach for controlling noise in superconducting quantum circuits that overcomes the drawbacks of previous technologies. Specifically, the present disclosure recognizes that dominant sources of noise can arrive via molecular species found in ambient surroundings, rather than inherently from materials and geometries utilized therein. For instance, molecular oxygen is a magnetically active species that exhibits long range magnetic order at low temperatures and pressures. Adsorption of molecular oxygen can lead to appreciable magnetic noise in superconducting quantum circuits, such as superconducting qubits. Therefore, in accordance with the present invention, provided systems and methods are directed to controlling the proximate environment of superconducting quantum circuits. By suppressing surface effects, such as magnetically active defects, sources of noise can be appreciably reduced or eliminated.

In accordance with one aspect of the present disclosure, a method for reducing magnetic noise in qubit circuits is provided. The method includes providing one or more qubit circuits, and arranging the one or more qubit circuits in a hermetic enclosure capable of isolating the one or more qubit circuits from ambient surroundings. The method also includes controlling a background pressure of one or more magnetically active species in the hermetic enclosure to suppress magnetically active surface defects associated with the one or more qubit circuits.

In accordance with another aspect of the present disclosure, a system for suppressing magnetically active surface defects in superconducting quantum circuits is provided. The system includes a hermetic enclosure configured to accommodate therein one or more superconducting quantum circuits, and capable of isolating the one or more superconducting circuits from ambient surroundings. The system also includes a vacuum system removably coupled to the hermetic enclosure, and configured to control an environment in the hermetic enclosure such that magnetically active surface defects associated with the one or more superconducting quantum circuits are suppressed.

In accordance with yet another aspect of the present disclosure, a method for suppressing magnetically active surface defects in superconducting quantum circuits is provided. The method includes providing one or more superconducting quantum circuits, and arranging the one or more superconducting quantum circuits in a hermetic enclosure. The method also includes controlling an environment in the hermetic enclosure to suppress magnetically active surface defects associated with the one or more superconducting quantum circuits.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Surface effects, such as magnetically active defects, can represent significant sources of noise that can impede or limit the functionality of certain superconducting devices. For example, recent investigations by the inventors demonstrated that the dominant contribution to magnetic flux noise observable in superconducting quantum bit ("qubit") devices originated from oxygen-containing adsorbates that produced a high density of magnetically active defects at the surface of superconducting devices. Such low-frequency magnetic flux noise represents a dominant source of dephasing, a key figure of merit for superconducting qubit operation.

Therefore, the present disclosure describes systems and methods directed to controlling the environment of superconducting quantum circuits for purposes including mitigating potential sources of noise, such as magnetic noise, found therein. For instance, as will be described, the density of surface defects, such as magnetically active surface defects, may reduced by limiting or prevention exposure to, and/or inducing desorption of active adsorbates, such as oxygen-containing adsorbates.

Figure 1:
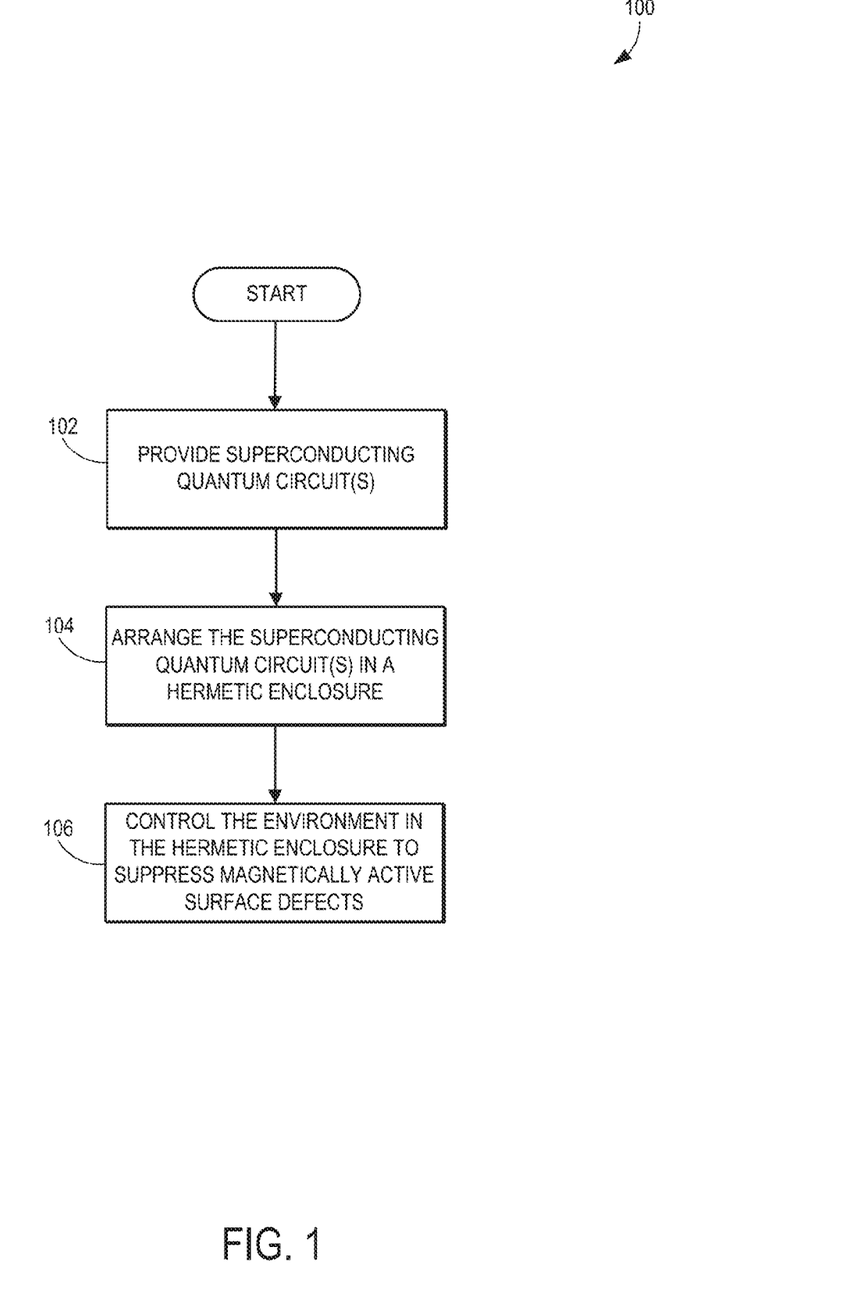
FIG. 1 shows a flowchart setting forth steps of a method in accordance with the present disclosure.

Turning to FIG. 1, a flowchart setting forth steps of a process 100 in accordance with aspects of the present disclosure is shown. The process 100 may begin at process block 102 where one or more superconducting quantum circuit(s), such as qubit circuits, may be provided. In some aspects, the one or more superconducting quantum circuit(s) may be fabricated at process block 102 in accordance with standard device practice. In some designs, the surface of the superconducting quantum circuit(s) may be coated with a non-magnetic encapsulation layer. This may be advantageous particularly to devices that are sensitive to magnetically active defects and magnetic noise. By way of example, candidate materials can include waxes, similar to the etch resist Apiezon W, with layer thicknesses on the order of millimeters, although other materials and layer thickness may be possible.

At process block 104, the superconducting quantum circuit(s) may then be arranged or positioned in a hermetic enclosure configured to accommodate therein one or more superconducting quantum circuits. As will be described, the sealable hermetic enclosure can be configured in any manner, and capable of a range of functionality, including isolating the superconducting quantum circuit(s) from ambient surroundings.

Then, as indicated by process block 106, the environment in the hermetic enclosure may be controlled, for instance, in a manner such that magnetically active surface defects in the superconducting quantum circuit(s) are suppressed. In some aspects, this step can include generating a vacuum or near-vacuum environment, for instance, by operating a vacuum system coupled to the hermetic enclosure.

In some modes of operation, the vacuum system may be capable of controlling the background pressure of the hermetic enclosure such that high vacuum or ultrahigh vacuum conditions are achieved. By way example, a high vacuum can be in a pressure range roughly between $10^{-6}$ to $10^{-8}$ Torr, and ultrahigh vacuum can be in a range of $10^{-8}$ Torr or lower, although other pressure values may be possible. In some aspects, the temperature of the hermetic enclosure may be elevated while reducing the pressure therein in order to bake out, or desorb, and subsequently remove active adsorbates or contaminants present in or about the enclosure walls. In some aspects, the native surface of the superconducting circuits can be passivated or modified at process block 106, for example, by backfilling, or pressurizing, the hermetic enclosure after evacuation with an inert or non-magnetic gas, such as ammonia gas. In addition, the surface of the superconducting circuits can also be irradiated using light at process block 106, for instance, while performing a device cool-down protocol in order to promote photodesorption of active adsorbates. By way of example, ultraviolet light may be used to irradiate the superconducting circuit(s).

Performing any combination of the steps detailed with respect to process block 106, the density of one or more active species, such as magnetically active species, may be controlled such that sources of noise can be appreciably reduced. In particular, any such steps can be applied to the superconducting quantum circuit(s) or portions thereof that are sensitive to noise and dephasing, and are particularly relevant to large-scale multi-qubit circuits for gate-based quantum computing or quantum annealing.

Figure 2:
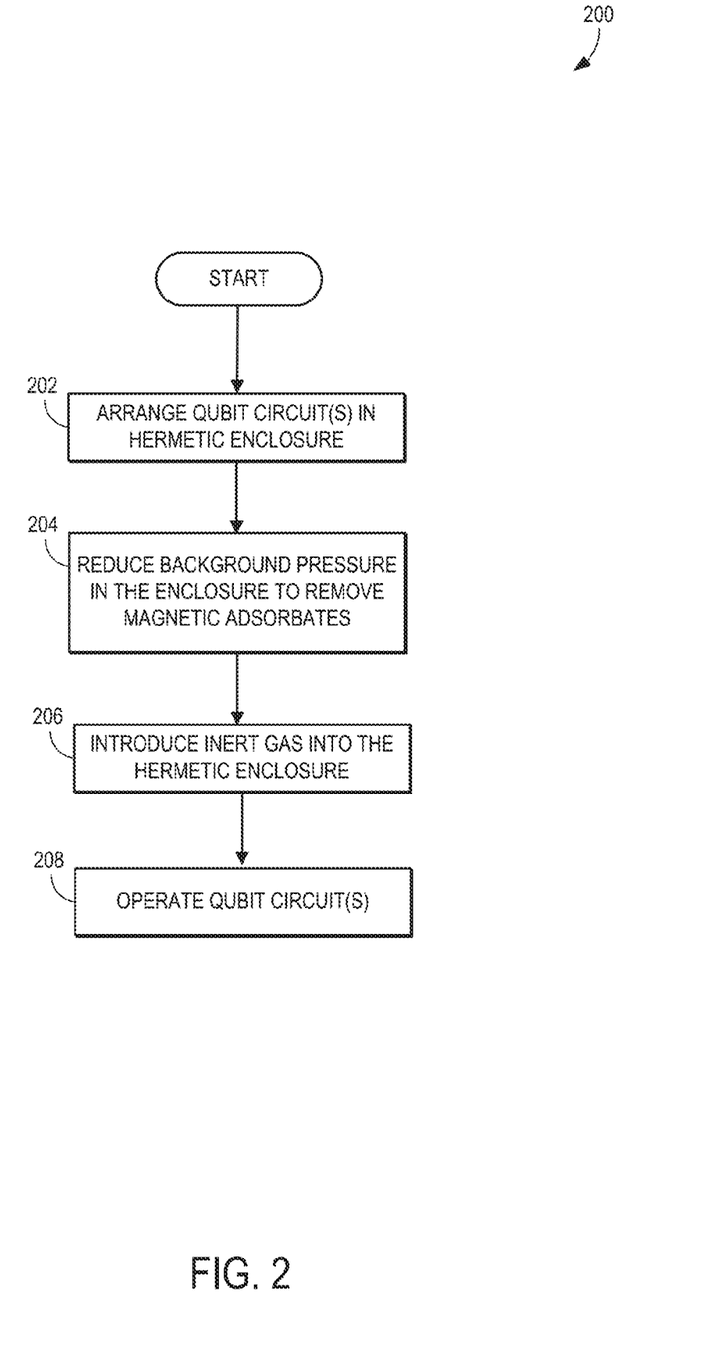
FIG. 2 shows another flowchart setting forth steps of a method in accordance with the present disclosure.

Turning to FIG. 2, another flowchart setting forth steps of a process 200 in accordance with aspects of the present disclosure is shown. The process 200 may begin at process block 202 where one or more qubit circuit(s) or devices are arranged or positioned in a hermetic enclosure.

At process block 204, the environment in the hermetic enclosure may be controlled by reducing background pressure to obtain a target coverage, or lack thereof, of magnetic, as well as other undesirable adsorbates, on the surface of the qubit circuit(s). As described, this can be achieved by evacuating the hermetic enclosure to a high or ultrahigh vacuum, while optionally baking out the enclosure. In some aspects, as indicated by process block 206, evacuation may also be followed by backfilling the enclosure with inert gases in order to occupy available adsorption sites at the surface of the qubit circuit(s), thus preventing the adsorption of residual magnetically active species, such as molecular oxygen. By way of example, ammonia gas may be a suitable candidate for passivating a device surface such that magnetically active surface defects are suppressed, although other gases are also possible.

At process block 208, the qubit circuit(s) may then be operated with a suppressed density of surface defects. As described, qubit circuit(s) may particularly benefit from a reduced density of magnetically active surface defects that would reduce sources of noise, decoherence and dephasing. In some aspects, further control in the density of magnetically active adsorbed defects can include irradiation of the qubit circuit(s) in the hermetic enclosure with light, such as ultraviolet light, either during the evacuation process at process block 204, and/or during a cool down process associated with operation at process block 208.

In accordance with aspects of the present disclosure, a system for suppressing magnetically active surface defects in superconducting quantum circuits is provided. The system can include a hermetic enclosure configured to accommodate therein at least one or more superconducting quantum circuits, such as qubit circuits, and a vacuum system removably coupled to the hermetic enclosure, and configured to control an environment in the hermetic enclosure such that surface defects, such as magnetically active surface defects, associated with the superconducting quantum circuits are suppressed.

The hermetic enclosure can be designed in any manner, and include capabilities for controlling and operating devices, circuits or circuit components, including superconducting quantum circuits, arranged therein. Specifically, the hermetic enclosure may be capable of isolating such devices, circuits or circuit components from ambient surroundings. This may be implemented using various features or elements suitable for achieving and sustaining vacuum or near-vacuum conditions, pressurized conditions, low-temperature conditions, and so forth. For instance, in some implementations, the hermetic enclosure may contain all-metal seals, such as conflat gaskets, and be constructed from welded aluminum with aluminum-stainless steel bimetal flanges for the vacuum seals, or may be constructed from an alloy of titanium machined to form knife edges for use in producing vacuum seals. However, the hermetic enclosure may be constructed in other ways as well.

Other functionalities of the hermetic enclosure include, for instance, configurations for mitigating, reducing or eliminating sources of noise found in ambient surroundings, such as thermal, electrical, and magnetic sources of noise, and other sources of noise. Also, the hermetic enclosure may configured to include or accommodate a heat source for elevating a temperature of the hermetic enclosure, for example, during an evacuation process. The hermetic enclosure may also include a light source, such as an LED device, capable of irradiating devices, circuits or circuit components therein using light, such as ultraviolet light. For instance, the light source may be operated during a cooling procedure, such that active species present on the surface of the superconducting circuits are desorbed.

Figure 3A:
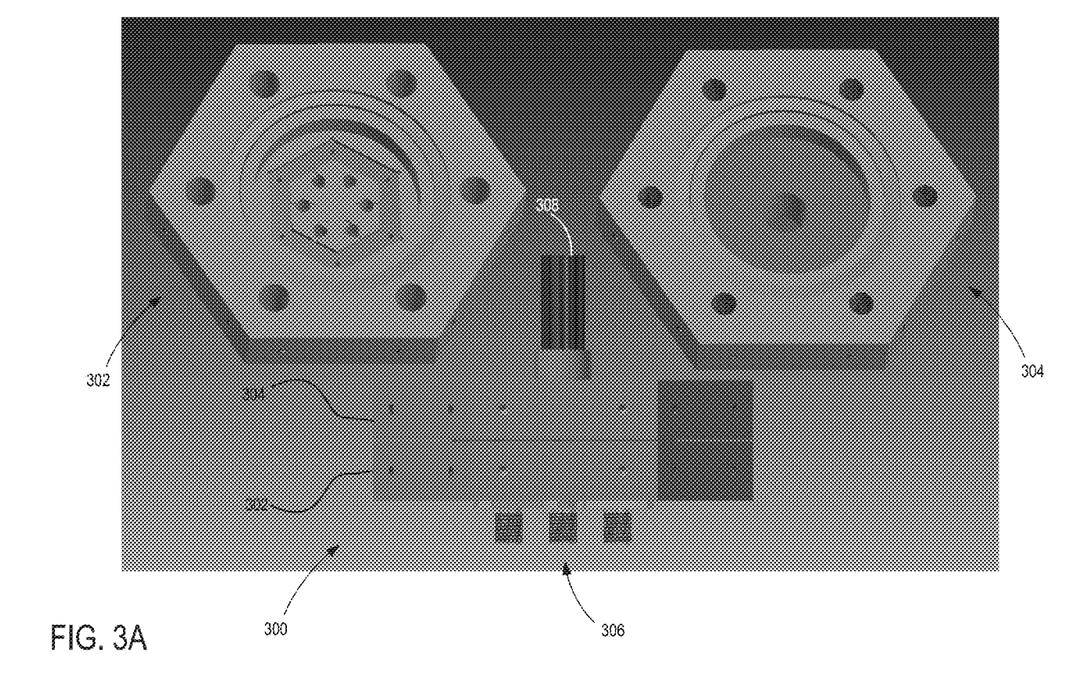
FIG. 3A shows an example hermetic enclosure in accordance with aspects of the present disclosure.

By way of example, FIG. 3A shows an example hermetic enclosure 300 in accordance with aspects of the present disclosure. As illustrated, the hermetic enclosure 300 may be constructed using a first enclosing portion 302 and second enclosing portion 304, which when coupled together via a metallic seal, or other seal, can provide vacuum-tight enclosure. The hermetic enclosure 300 is shown to include a number of electrical feedthroughs 306 connectable to circuits arranged therein, although it may be appreciated that other types of feedthroughs are possible. The hermetic enclosure also includes a sealable evacuation port 308 configured to be coupled to the vacuum system such that environment in the hermetic enclosure 300 can be controlled.

The hermetic enclosure 300 may be manufactured using any materials suitable for controlling an environment therein. By way of example, the hermetic enclosure may be fabricated from grade 5 titanium alloy (Ti-6A1-4V), with the following advantageous properties: 1) the material is hard enough to form an ultrahigh vacuum conflat seal; 2) the material is known for its low outgassing and is compatible with the desired ultrahigh vacuum environment; 3) there are commercially available weld-in hermetic wiring feedthroughs, for example of the SMA type, enabling high-bandwidth electrical connections into an ultrahigh vacuum environment; 4) Grade 5 titanium is a nonmagnetic material that is superconducting at low temperatures. This provides magnetic shielding for circuits or devices assembled in the hermetic enclosure 300 that are sensitive to external magnetic field fluctuations.

The vacuum system (not shown in FIG. 3A) may be configured to control a background pressure of one or more active species in the hermetic enclosure 300, such as magnetically active species like molecular oxygen. As described, this may be achieved by evacuating the hermetic enclosure 300 to a high or ultrahigh vacuum, and optionally baking out the hermetic enclosure 300 using a heat source.

In some aspects, the vacuum system may be configured to introduce inert gases into the hermetic enclosure 300 in order to passivate active surface defects of the superconducting circuits therein, the inert gas occupying available adsorption sites. For example, ammonia gas may be utilized, although other gases may also be possible. In the case of qubit circuits, this would prevent surface adsorption of residual magnetically active species, such as molecular oxygen, and hence further suppress sources of qubit decoherence and dephasing.

Figure 3B:
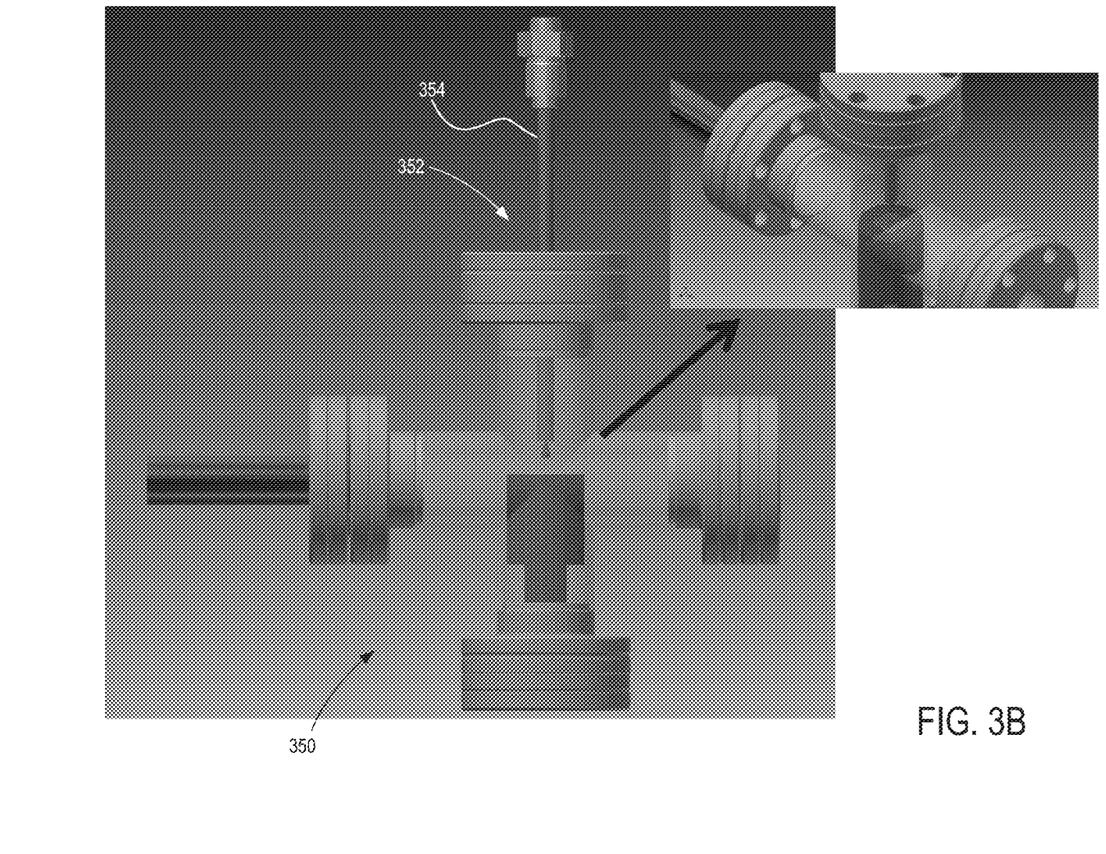
FIG. 3B shows an example of vacuum enclosure for use in coating the surfaces of superconducting circuits with non-magnetic encapsulation layers to prevent subsequent adsorption of magnetically active defects, in accordance with aspects of the present disclosure.

Turning to FIG. 3B, an example of vacuum enclosure 350, for use in coating the surfaces of superconducting circuits with non-magnetic encapsulation layers, is shown. Such encapsulation layers would prevent adsorption of magnetically active defects found in close proximity to the superconducting circuits, where coupling to the surface defects is strong. By way of example, non-magnetic encapsulation materials for use in the vacuum enclosure 350 may include etch resist waxes, such as Apiezon W, or UHV-compatible epoxies, such as Torr Seal or Epo-tek, but other encapsulation materials are possible.

The vacuum enclosure 350 may include a broad range of functionality, including capabilities for controlling an environment therein, for instance, by reducing ambient pressure to achieve vacuum or near vacuum conditions, or a targeted background pressure. In addition, the vacuum enclosure 350 may be configured with capabilities to dispense or deposit non-magnetic encapsulation layers upon surfaces of superconducting circuits therein. As shown in the example of FIG. 3B, the vacuum enclosure 350 can include an inlet 352 configured to dispense non-magnetic encapsulation layers using a dispensing tube 354. However, it may be appreciated, however, that other methods for coating the surface of a device inside the vacuum enclosure 350, using a non-magnetic encapsulation layer, may be possible. Following vacuum encapsulation, the device can be exposed to atmosphere, as well as cooled to low temperatures in a non-hermetic enclosure, without appreciably deleterious consequences, since any magnetically active defects would be prevented from adsorbing in close proximity to the device.

Low-frequency 1/f flux noise is a dominant source of dephasing in superconducting Josephson qubits. While it is possible to avoid flux noise by replacing SQUID loops with single junctions or by operating the qubit at a so-called flux "sweet spot," where the device is insensitive to first order to magnetic flux fluctuations, such strategies severely constrain qubit gates, and hence overall architectures, since such limited qubits would no longer be tunable. In previous investigations by the inventors, it was demonstrated that there exists a high density of unpaired magnetic defect states in the surfaces of superconducting thin films, and it is believed that such defects are the source of the ubiquitous 1/f flux noise. Therefore, systems and methods, in accordance with aspects of the present disclosure, can be used to reduce 1/f flux noise by controlling the environment proximate to qubit devices, such that magnetically active surface defects are suppressed.

Figure 4:
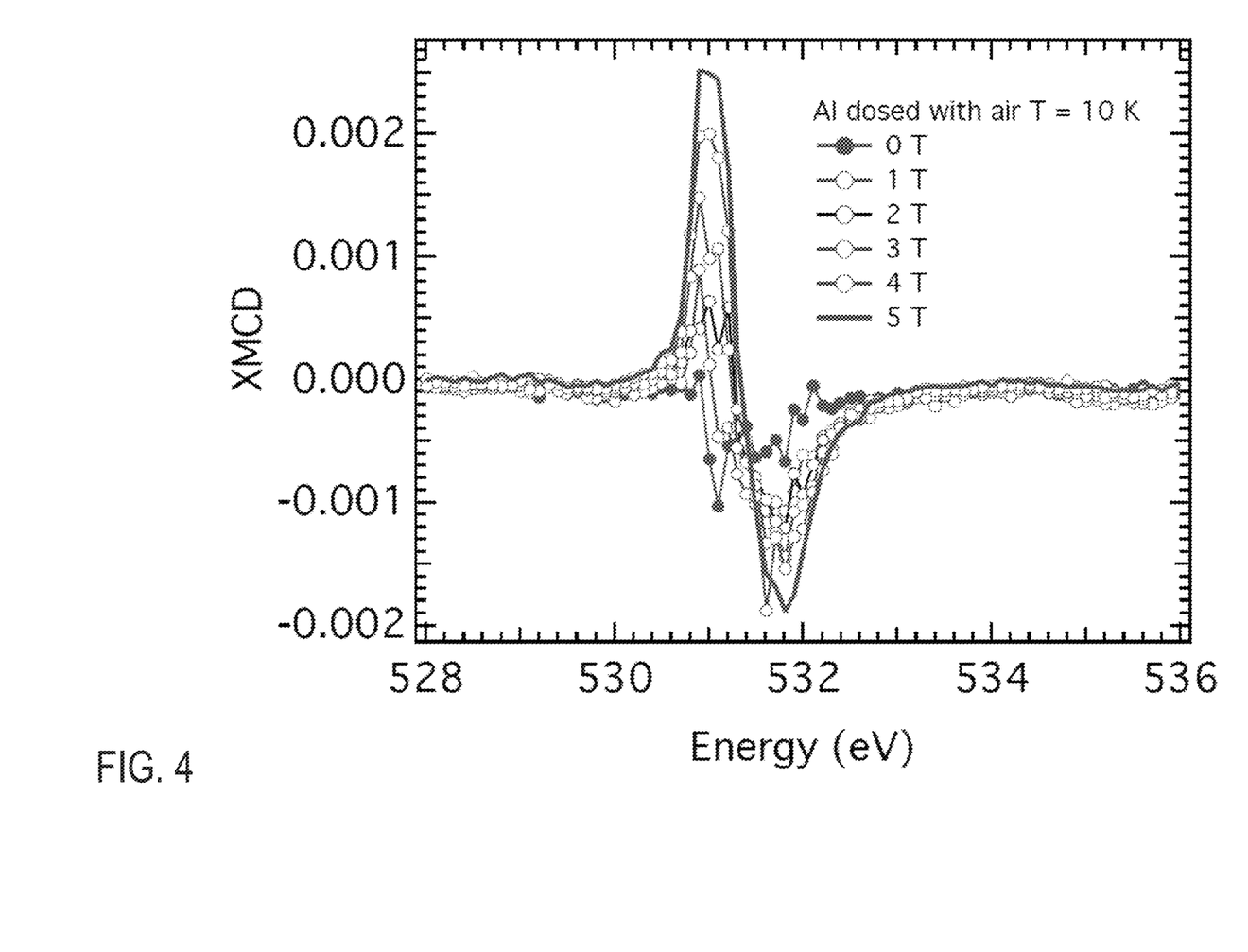
FIG. 4 is a graph showing oxygen x-ray magnetic circular dichroism ("XMCD") signal for thin film air-dosed aluminum as a function of magnetic field at 10 Kelvin.
Figure 5:
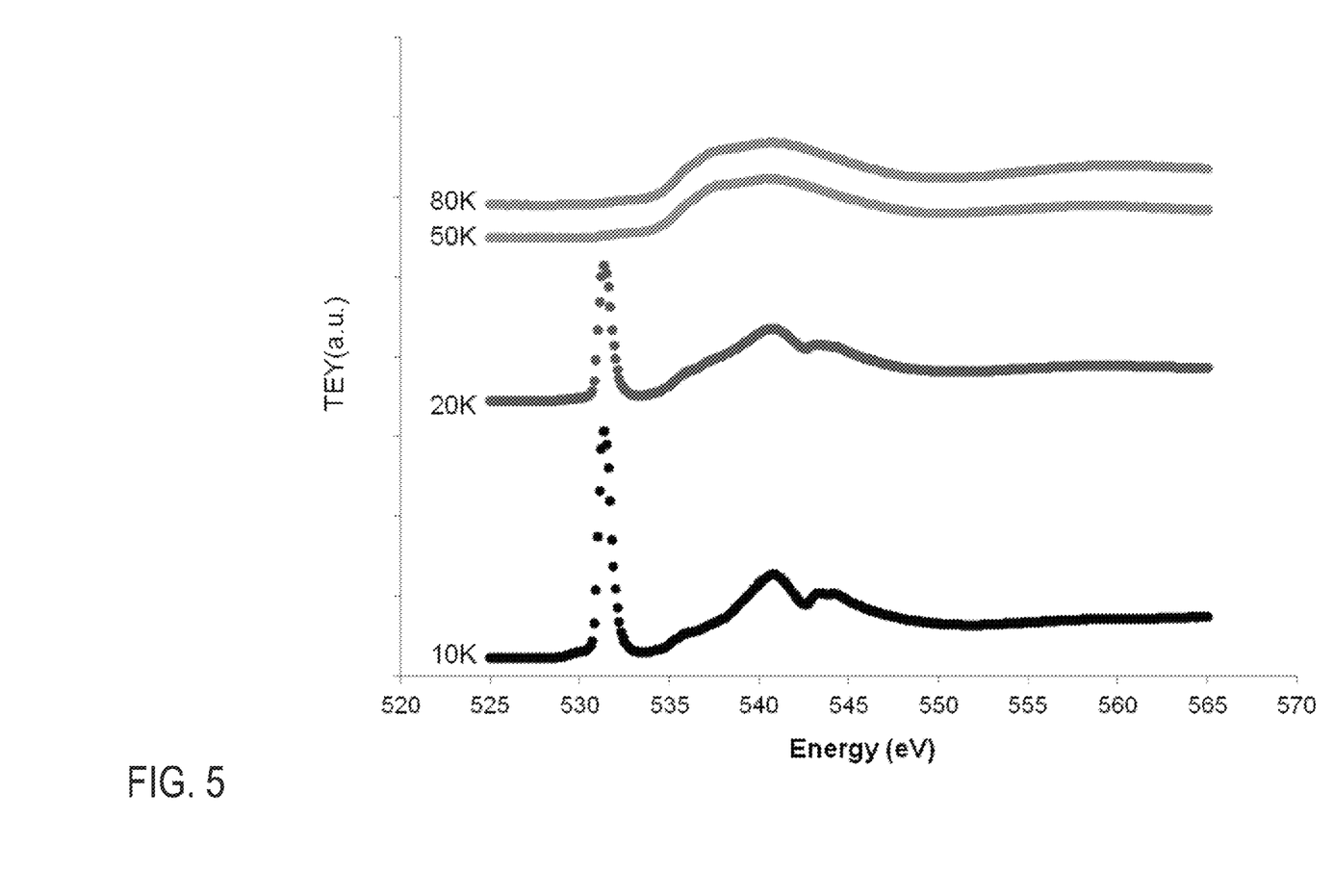
FIG. 5 is a graph of X-ray absorption spectra for thin film air-dosed aluminum indicating the presence of adsorbed molecular oxygen for temperatures below 50 Kelvin.
Figure 6:
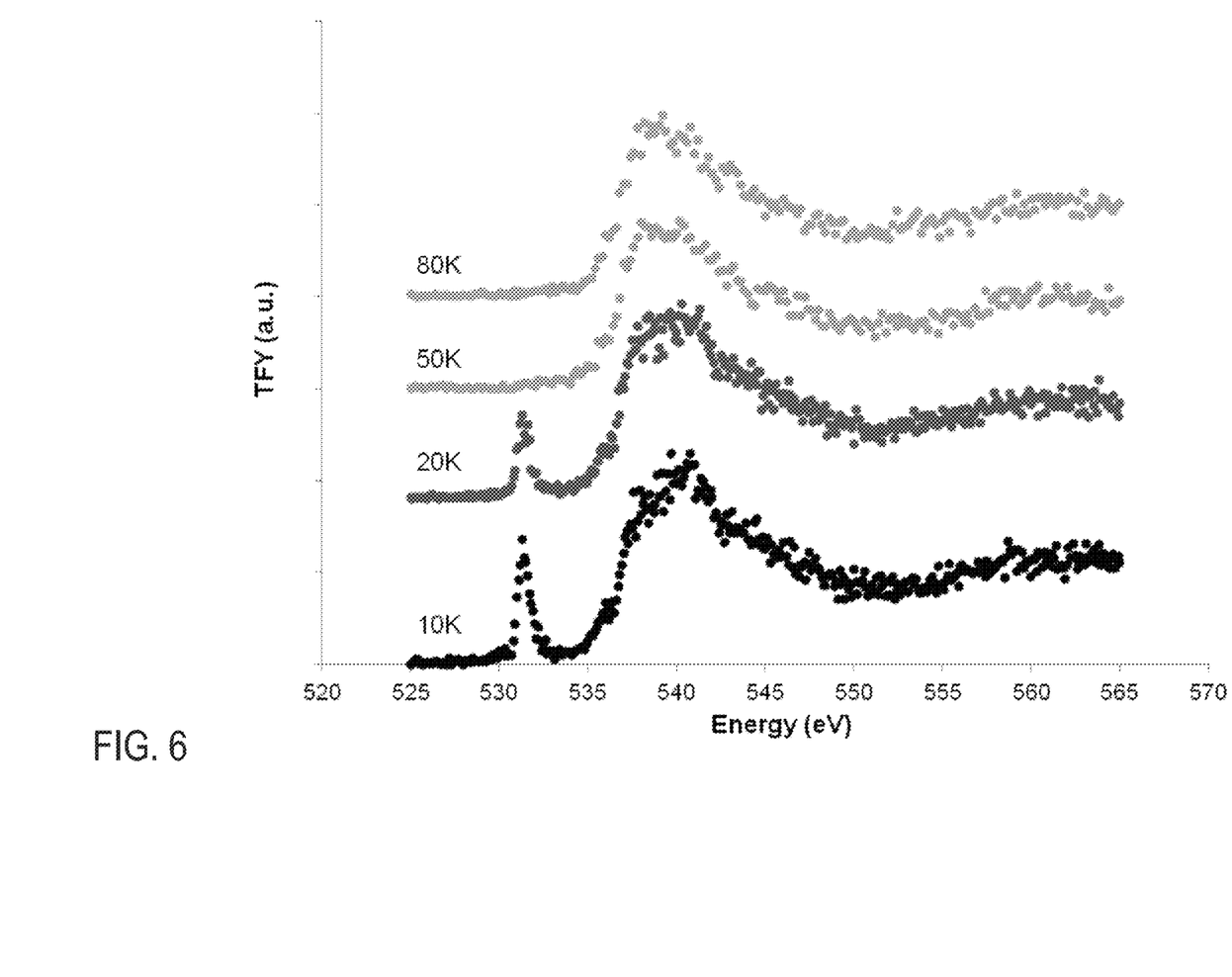
FIG. 6 is another graph of X-ray absorption spectra for thin film air-dosed aluminum indicating the presence of adsorbed molecular oxygen for temperatures below 50 Kelvin.

In experiments involving an X-ray Magnetic Circular Dichroism ("XMCD") technique, native superconducting thin film samples were irradiated with left and right circularly polarized x-rays, and the differences in absorption spectra at various x-ray edges were examined. By way of example, FIG. 4 shows a graph of oxygen XMCD signal for thin film air-dosed aluminum as a function of magnetic field at 10 Kelvin. Differences in x-ray absorption for the opposite x-ray helicities reveal the orbital, and in some cases spin, polarization of the hole states to which the photoelectrons are promoted. Oxygen and aluminum K-edges of native aluminum films, and the oxygen K-edge and niobium L-edge of native niobium films were investigated (both the aluminum and niobium films were covered with amorphous thermal oxide due to exposure to atmosphere). When the samples were cooled down to 10 K in ultrahigh vacuum, no evidence of magnetism at any of the absorption edges was observed. However, when $10^{-5}$ Torr of air was introduced into the sample chamber for one minute while the samples were cold, it was found that the oxygen K-edge spectrum changed dramatically, and a large XMCD signal appeared, as illustrated in FIGS. 5 and 6. Specifically, FIG. 5 shows the appearance of an oxygen K-edge signal in the absorption spectra of an air-dosed aluminum thin film obtained using a total electron yield ("TEY") mode. A peak around 531 eV develops when the sample is cooled below 50 K. At 10 K, a strong signal at the oxygen K-edge can be observed indicating the presence of an adsorbed layer of oxygen on the thin film surface. Similar results may be observed in the X-ray absorption spectra using a total fluorescence yield ("TFY") mode (FIG. 6).

Density functional theory calculations assigned the measured XMCD signal to molecular oxygen, which is known to be magnetically active and exhibit long-range magnetic order in the low-temperature, low-pressure regime relevant to superconducting qubit applications. Moreover, the data support an early speculation that reduced levels of flux noise seen in nitride-encapsulated SQUIDs were due to the fact that the magnetic moment of oxygen has a much higher energy barrier to reorientation on a nitride surface than on an oxide surface, so that adsorbed oxygen would remain magnetically active on conventional oxide-encapsulated devices, but not on nitride-encapsulated devices. In other experiments, the inventors showed that the magnetic signature of adsorbed air is identical to that of pure oxygen. This may be understood as a consequence of the extremely low solubility of nitrogen in solid molecular oxygen. Significant adsorption of oxygen is observed only below 50 K and only when the background pressure in the cryostat is worse than a few times $10^{-8}$ Torr.

In recognizing that dominant sources of noise in superconducting quantum circuits or devices need not be intrinsic to the materials and geometries utilized, but rather originating from active species present under ambient conditions, the present disclosure provides a novel approach to control the proximate environment of the devices prior to and/or during operation of such circuits or devices.

Figure 7:
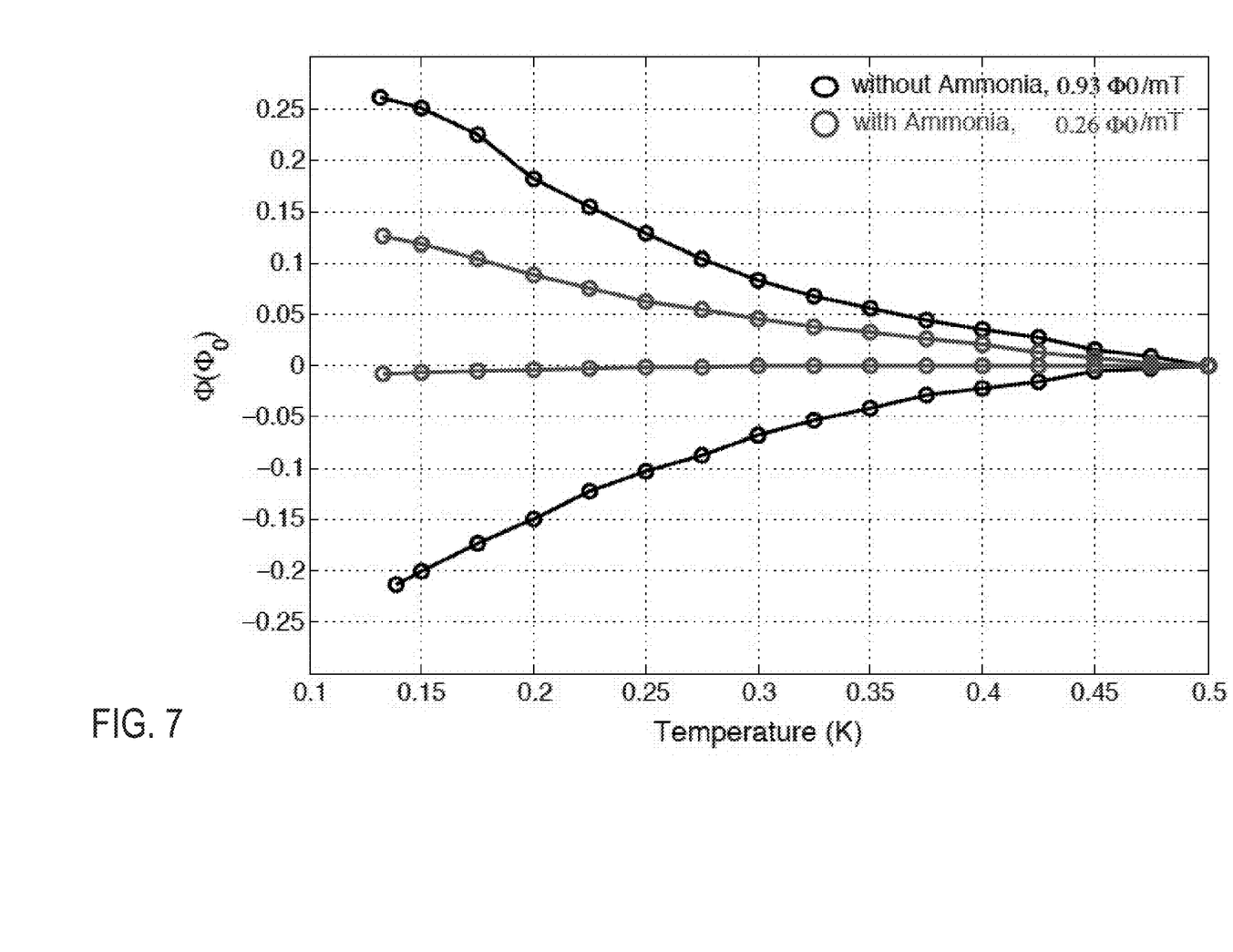
FIG. 7 is a graph illustrating the effect of ammonia exposure on a superconducting quantum interference device ("SQUID").

As described, this can include generating vacuum or near-vacuum conditions in a hermetic enclosure housing the circuits or devices, as well as pressurizing the enclosure with an inert gas. By way of example, FIG. 7 shows the temperature dependence of flux in a SQUID device before and after exposure to ammonia gas for a cooling field of ±256 microTesla. The data shows about a three times reduction in the surface spin density after ammonia exposure.

Figure 8:
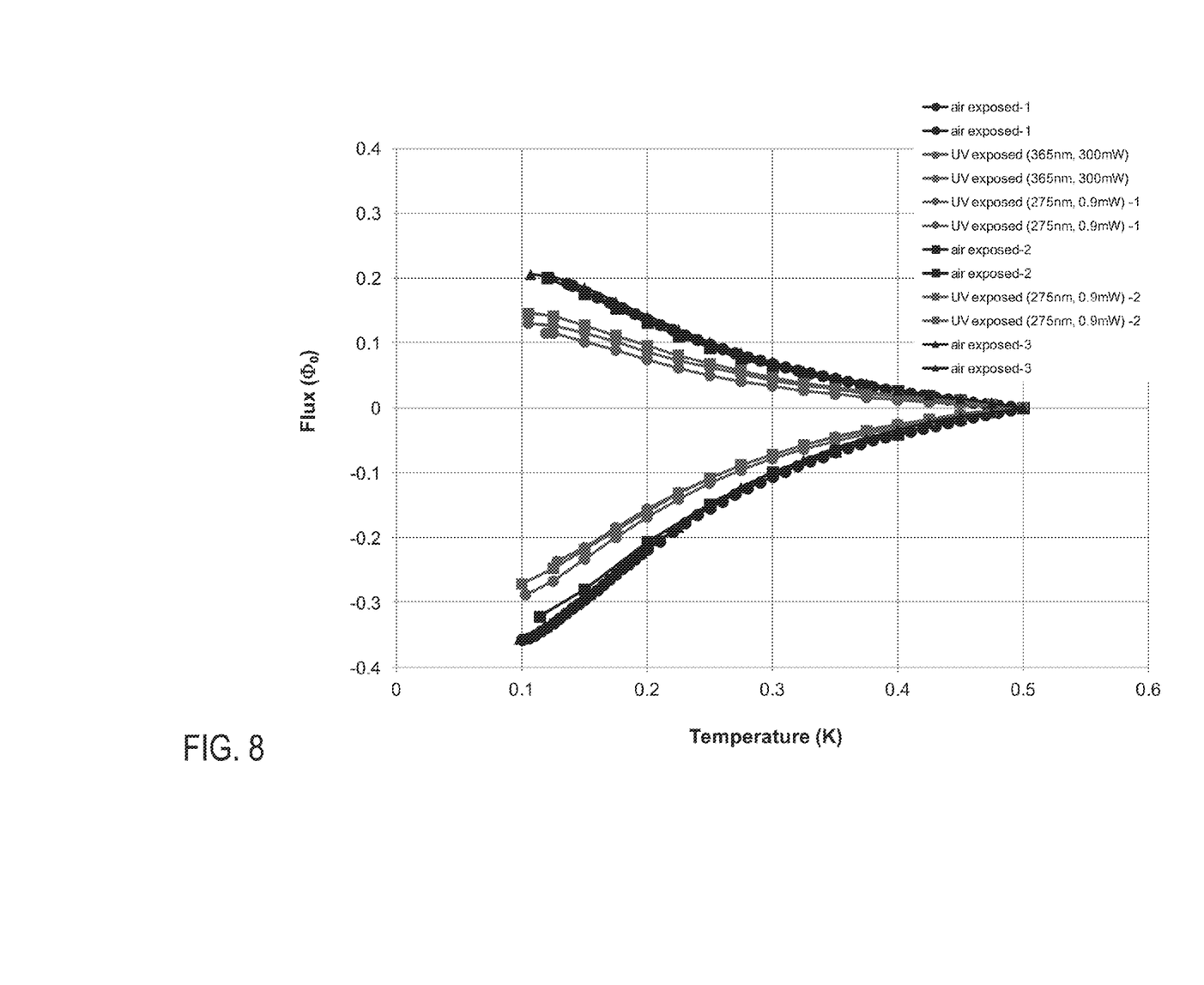
FIG. 8 is a graph illustrating the effect of ultraviolet light exposure on a SQUID.
Figure 9:
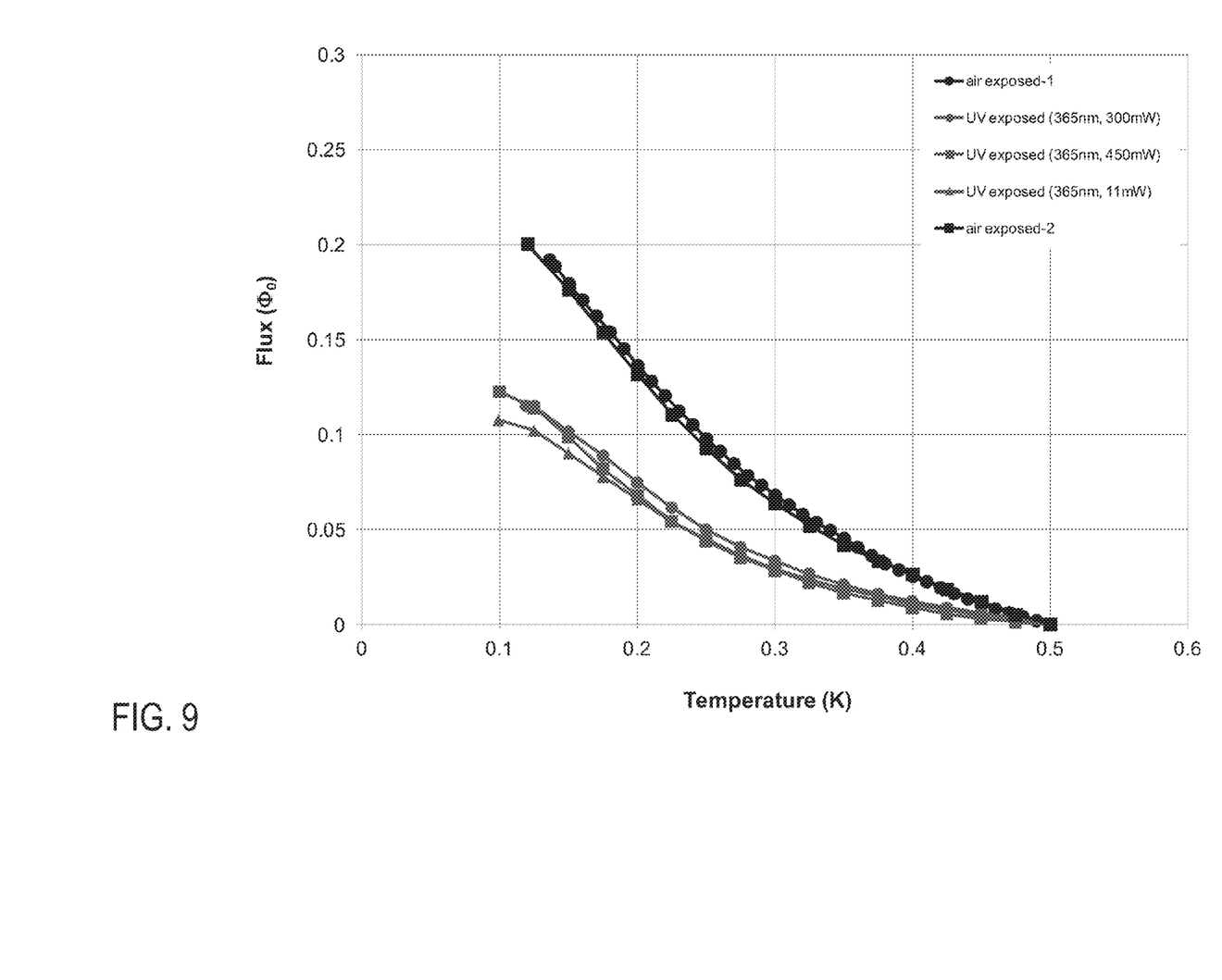
FIG. 9 is a graph illustrating the effect of ultraviolet light power on a SQUID.

In addition, suppressing active surface defects, in accordance with the present disclosure, can be achieved by exposure to light, such as ultraviolet light. By way of example, FIG. 8 shows the temperature dependence of flux in a SQUID device subjected to various ultraviolet exposure conditions compared to air exposure. The device was irradiated with ultraviolet light at different wavelengths, namely 275 nm, and 365 nm, while cooling down from room temperature to 3 K. About 30% decrease in spin density is observed after ultraviolet exposure, suggesting that ultraviolet light provides energy, which is unfavorable for the surface adsorption process. Similarly, FIG. 9 shows flux versus temperature curves for a device using three different ultraviolet light powers. No significant change in spin density was observed when the power level was varied from 11 mW to 450 mW.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reducing magnetic noise in qubit circuits, the method comprising:
   providing one or more qubit circuits;
   arranging the one or more qubit circuits in a hermetic enclosure capable of isolating the one or more qubit circuits from ambient surroundings; and
   controlling a background pressure of one or more magnetically active species in the hermetic enclosure to suppress magnetic active surface defects associated with the one or more qubit circuits.

2. The method of claim 1, wherein the one or more magnetically active species comprises oxygen.

3. The method of claim 1, the method further comprising elevating a temperature of the hermetic enclosure.

4. The method of claim 1, the method further comprising irradiating the one or more qubit circuits using ultraviolet light.

5. The method of claim 1, the method further comprising passivating a surface of the one or more qubit circuits.

6. The method of claim 1, the method further comprising coating a surface of the one or more qubit circuits with a non-magnetic encapsulation layer.

7. The method of claim 1, the method further comprising introducing an inert gas into the hermetic enclosure.

8. The method of claim 7, wherein the inert gas includes an ammonia gas.

9. The method of claim 1, wherein the background pressure is less than about $1 \cdot 10^{-6}$ Torr.

10. A system for suppressing magnetically active surface defects in superconducting quantum circuits, the system comprising:
    a hermetic enclosure configured to accommodate therein one or more superconducting quantum circuits, and capable of isolating the one or more superconducting circuits from ambient surroundings; and
    a vacuum system removably coupled to the hermetic enclosure, and configured to control an environment in the hermetic enclosure such that magnetic active surface defects associated with the one or more superconducting quantum circuits are suppressed.

11. The system of claim 10, wherein the one or more superconducting quantum circuits includes at least one qubit circuit.

12. The system of claim 10, wherein the vacuum system is further configured to control a background pressure of one or more magnetically active species in the hermetic enclosure.

13. The system of claim 12, wherein the background pressure is less than about $1 \cdot 10^{-6}$ Torr.

14. The system of claim 12, wherein the magnetically active species comprises oxygen.

15. The system of claim 10, wherein the vacuum system is further configured to introduce an inert gas in the hermetic enclosure to passivate a surface of the one or more superconducting quantum circuits.

16. The system of claim 15, wherein the inert gas includes an ammonia gas.

17. The system of claim 10, the hermetic enclosure further comprising a light source capable of irradiating the one or more superconducting circuits using ultraviolet light.

18. The system of claim 10, the system further comprising a heat source for elevating a temperature of the hermetic enclosure.

19. A method for suppressing magnetically active surface defects in superconducting quantum circuits, the method comprising:
   providing one or more superconducting quantum circuits;
   arranging the one or more superconducting quantum circuits in a hermetic enclosure; and
   controlling an environment in the hermetic enclosure to suppress magnetic active surface defects associated with the one or more superconducting quantum circuits.

20. The method of claim 19, wherein the one or more superconducting quantum circuits includes at least one qubit circuit.

21. The method of claim 19, wherein controlling the environment includes reducing a background pressure of one or more magnetically active species in the hermetic enclosure using a vacuum system coupled to the hermetic enclosure.

22. The method of claim 21, wherein the magnetically active species comprises oxygen.

23. The method of claim 19, the method further comprising elevating a temperature of the hermetic enclosure.

24. The method of claim 19, the method further comprising irradiating the one or more superconducting circuits using ultraviolet light.

25. The method of claim 19, the method further comprising passivating a surface of the one or more superconducting quantum circuits.

26. The method of claim 19, the method further comprising coating a surface of the one or more superconducting quantum circuits with a non-magnetic encapsulation layer.

27. The method of claim 19, the method further comprising introducing an inert gas into the hermetic enclosure to passivate a surface of the one or more superconducting quantum circuits.

28. The method of claim 27, wherein the inert gas includes an ammonia gas.

* * * * *

UNITED STATES PATENT AND TRADEMARK OFFICE
CERTIFICATE OF CORRECTION

PATENT NO. : 9,437,800 B1
APPLICATION NO. : 14/632505
DATED : September 6, 2016
INVENTOR(S) : Robert Francis McDermott, III et al.

Page 1 of 1

It is certified that error appears in the above-identified patent and that said Letters Patent is hereby corrected as shown below:

In the Claims

Column 8, Claim 1, Line 39, "magnetic" should be --magnetically--.

Column 8, Claim 2, Line 42, "comprises oxygen" should be --comprises molecular oxygen--.

Column 9, Claim 10, Line 1, "magnetic" should be --magnetically--.

Column 9, Claim 14, Line 14, "comprises oxygen" should be --comprises molecular oxygen--.

Column 10, Claim 22, Line 14, "comprises oxygen" should be --comprises molecular oxygen--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*